United States Patent [19]

Schuett et al.

[11] Patent Number: 4,985,649
[45] Date of Patent: Jan. 15, 1991

[54] CONNECTION NETWORK FOR THE ADJUSTABLE CONNECTION OF A PLA

[75] Inventors: Dieter Schuett; Winfried Glaeser, both of Munich, Fed. Rep. of Germany

[73] Assignee: Siemens Aktiengesellschaft, Berlin and Munich, Fed. Rep. of Germany

[21] Appl. No.: 423,446

[22] PCT Filed: May 5, 1988

[86] PCT No.: PCT/DE88/00273
§ 371 Date: Sep. 12, 1989
§ 102(e) Date: Sep. 12, 1989

[87] PCT Pub. No.: WO88/09997
PCT Pub. Date: Dec. 15, 1988

[30] Foreign Application Priority Data

Jun. 5, 1987 [DE] Fed. Rep. of Germany ....... 3718916

[51] Int. Cl.⁵ .......................................... H03K 19/177
[52] U.S. Cl. .................... 307/465; 307/243; 307/443; 340/825.83
[58] Field of Search .............. 307/202.1, 443, 475, 307/465–469, 242–243; 340/825.79, 825.83, 825.85–825.87; 365/189.08

[56] References Cited

U.S. PATENT DOCUMENTS

| | | | |
|---|---|---|---|
| 3,818,452 | 6/1974 | Greer | 307/465 X |
| 4,293,783 | 10/1981 | Patil | 307/465 |
| 4,467,439 | 8/1984 | Rhodes | 340/825.87 X |
| 4,506,341 | 3/1985 | Kalter et al. | 307/465 X |
| 4,554,640 | 11/1985 | Wong et al. | 307/465 X |
| 4,667,181 | 5/1987 | Hastreiter | 340/825.79 X |
| 4,740,919 | 4/1988 | Elmer | 307/202.1 X |
| 4,910,508 | 3/1990 | Yamazaki | 307/465 X |
| 4,918,440 | 4/1990 | Furtek | 340/825.79 X |

FOREIGN PATENT DOCUMENTS 60-145726 8/1985 Japan .

OTHER PUBLICATIONS

Varadarajan, "Universal Logic Array", IBM TDB, vol. 20, No. 1, Jun. 1977, pp. 189–190.

*Primary Examiner*—David Hudspeth
*Attorney, Agent, or Firm*—Hill, Van Santen, Steadman & Simpson

[57] ABSTRACT

Circuit arrangements (ULB) can be connected to one another with the assistance of a connection network (VN). Every circuit arrangement (ULB) can thereby operate as transmitter or as receiver. The connection network (VN) contains a matrix that is composed of a connection matrix and of an adjustment matrix. In the connection matrix, the data lines (DL) leading to the circuit arrangements (ULB) cross with coupling lines, whereby switching elements are arranged at the crossing locations. The adjustment matrix is composed of adjustment lines that cross with the coupling lines, whereby switching elements are arranged at the crossing locations. The connections between the data lines can be determined by programming the switching elements in the connection matrix and in the adjustment matrix and by applying an adjustment code to the adjustment matrix. The assistance of control signals can thereby be used to determine whether the data lines represent a data input or a data output.

14 Claims, 5 Drawing Sheets

CONNECTION NETWORK FOR THE ADJUSTABLE CONNECTION OF A PLA

BACKGROUND OF THE INVENTION

The invention is directed to a connection network for adjustable connection of circuit arrangements, particularly programmable circuit arrangements, whereby every circuit arrangement can be transmitter or receiver. It is to be understood that the term "circuit arrangement" as used herein refers to a circuit element such as a programmable logic array (PLA).

It is required for some applications that a plurality of circuit arrangements be capable of being adjustably connected to one another. Each of these circuit arrangements can thereby be transmitter or receiver. This can be the case when a plurality of programmable circuits, abbreviated as PLA, are combined in a sequential logic system. Such programmable circuits contain an AND level and an OR level. The operation of the input signals in accord with a function table stored in the AND level ensues in the AND level. These operation results of the AND level that are also referred to as product terms, are supplied to the OR level and are operated there according to the function table contained in the OR level to form what are referred to as sum terms. The sum terms are output at the outputs of the OR level. Such a PLA has input lines that lead to the AND level and output lines that lead out from the OR level available to it. The structure of a programmable circuit arrangement can also be such that the AND level and the OR level are combined and it is possible to define by programming whether the lines leading into the programmable circuit arrangement—referred to as data lines in future—should be input lines or output lines.

SUMMARY OF THE INVENTION

The object underlying the invention is comprised in specifying a connection network for the adjustable connection of circuit arrangements that operate either as transmitter or as receiver. In a connection network of the species initially recited, this object is achieved in accord with the characterizing of patent claim 1.

The connection network is based on the principle of the bidirectional PLA, i.e. on the principle of a programmable circuit arrangement, whereby the lines employed as data lines can be set both as input line as well as output line with the assistance of a control signal. The connection of the data lines within the connection matrix ensues with the assistance of the adjustment matrix.

The advantage of this connection network is to be seen therein that every data line can be connected to every data line by programming the switching elements in the matrix in accord with a connection table and, moreover, the direction of the data transmission can be defined.

BRIEF DESCRIPTION OF THE DRAWINGS

Other improvements of the invention derive from the subclaims. The invention shall be set forth further with reference to exemplary embodiments that are shown in the figures. Shown are:

DESCRIPTION OF THE PREFERRED EMBODIMENT

Figure 1:
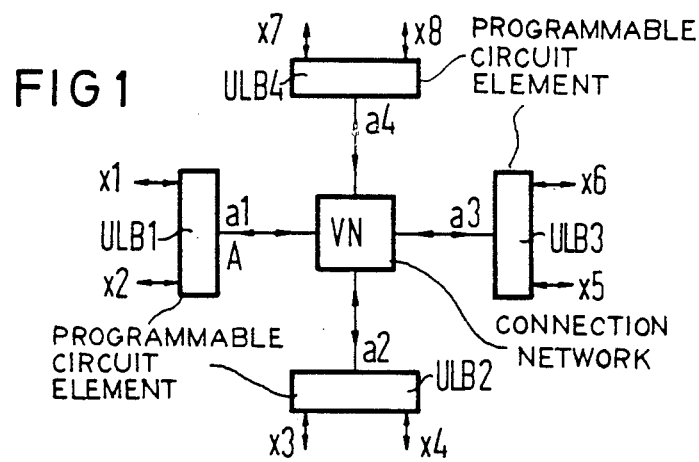
FIG. 1 a block circuit diagram of the connection network for connecting four circuit arrangements.

FIG. 1 yields a block circuit diagram wherein four circuit arrangements ULB1 through ULB4 can be connected to one another via a connection network VN. Bidirectional, programmable circuit arrangements can be provided, by way of example, as circuit arrangements ULB. These programmable circuit arrangements have lines on which signals X are supplied or taken and have terminals A that are to be connected to one another via the connection network VN. Data transmission lines therefore lead from the terminals A of the programmable circuit arrangements ULB to the connection network VN. The connection network VN is constructed such that these lines can be connected to one another in the connection network and such that the direction of the data transmission can be set. This means that the signals a on the data transmission lines between the programmable circuit arrangements ULB and the connection network VN can be adjustably transmitted in the one direction or in the opposite direction.

Figure 2:
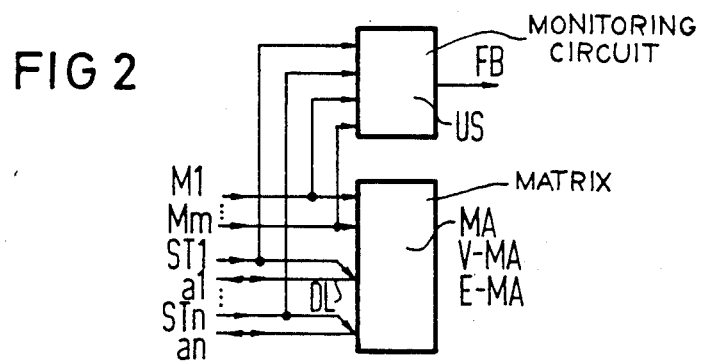
FIG. 2 a further block circuit diagram of the connection network.

FIG. 2 shows a block circuit diagram of the connection network VN. This can be composed of a matrix MA and of a monitoring circuit US. The core of the connection network VN is thereby the matrix MA. This is composed of a connection matrix V-MA and of an adjustment matrix E-MA. The data transmission lines lead into the connection matrix V-MA as data lines DL 1 through DLn (n=1 ...). The direction of the transmission of the signals a on the data lines DL is determined with the assistance of a control signal ST1 through STn. The connection between the data lines DL is realized inside the connection matrix V-MA. This connection between the data lines DL is influenced with the assistance of the adjustment matrix E-MA. The adjustment matrix E-MA is supplied with adjustment signals M1 through Mn that determine the connections between the data lines DL with the assistance of the adjustment matrix E-MA.

The assistance of a monitoring means US that can be additionally provided makes it possible to check whether the connection setup is faulty or not.

Figure 3:
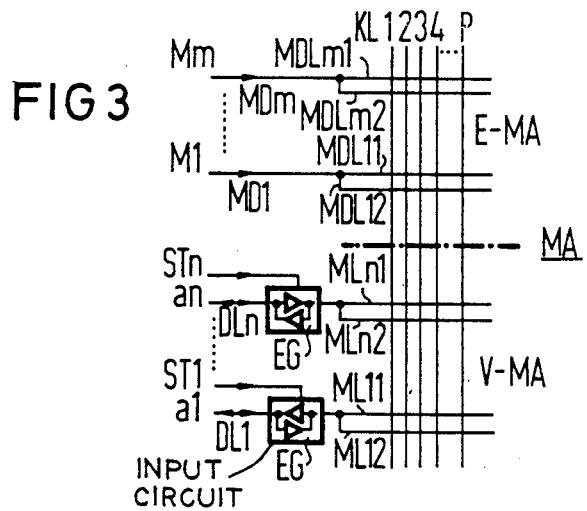
FIG. 3 a fundamental circuit diagram of the matrix employed in the connection network.

The structure of the matrix MA shall be set forth in greater detail with the assistance of FIG. 3. The matrix MA is composed of the connection matrix V-MA and of the adjustment matrix E-MA. The connection matrix V-MA is constructed of crossing data lines DL and of coupling lines KL; the adjustment matrix E-MA is constructed of crossing adjustment lines MD and of the coupling lines KL. It is advantageous for programming the matrix MA when the data lines DL branch into two matrix lines ML per data line DL and, correspondingly, the adjustment lines MD branch into respectively two adjustment sub-lines MDL. Respectively two connection possibilities thereby respectively arise per interconnect location between a data line or, respectively, adjustment line and a coupling line KL.

The direction of the transmission of data a on the data lines DL is determined with the assistance of control signals ST that are conducted to an input circuit EG arranged in the data line.

Figure 4:
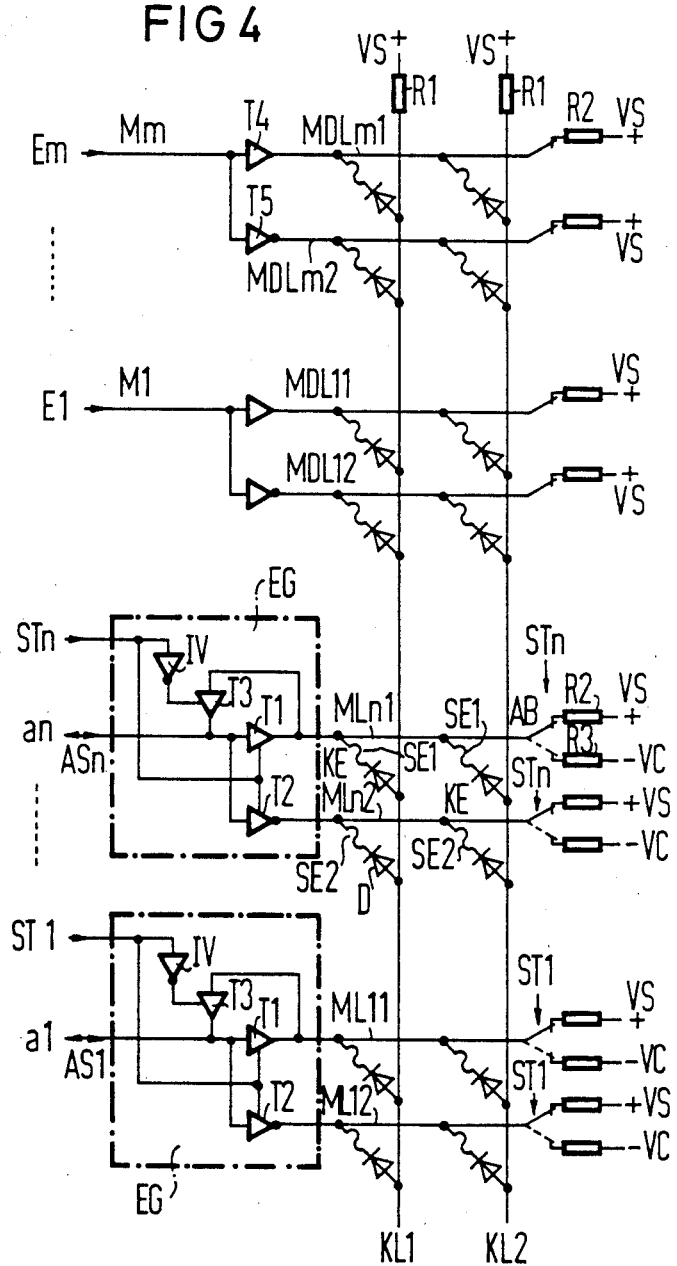
FIG. 4 a wiring diagram of the matrix.

A realization of the matrix can be derived from FIG. 4. It derives from FIG. 4 that switching elements KE are arranged at the interconnect locations, each of these switching elements KE being respectively composed of two logic elements SE1, SE2. These logic elements SE are disconnectable. For example, they can be composed of a diode D and of a fuse F that can be blown. With two switch elements per switching element KE, three statuses can be stored, for example a binary 1, a binary 0 and a third status. For example, the binary 1 can be stored when the logic element SE1 between the matrix line ML1 and a coupling line KL is not disconnected but, by contrast, the logic element SE2 between the matrix line ML2 and the coupling line KL is disconnected. A binary 0 is stored when the logic element SE2 between the matrix line ML2 and the coupling line KL is not disconnected but, by contrast, the logic element SE1 between the matrix line ML1 and the coupling line KL is disconnected. The third status is stored when both logic elements SE1, SE2 are disconnected.

The matrix lines ML1, ML2 are connectable either to the operating voltage source VS via a resistor R2 or to the operating voltage source VC via a resistor R3. VS can be 5 volts; VC can be 0 volts. The switching can ensue with the assistance of a switch over means AB. The switching ensues dependent on the control signal ST. When the control signal is such that a data line DL is connected as input, i.e. the data terminal AS is a data input, and, thus, driver stages T1, T2 can be driven conductive, then the matrix lines ML are connected to the operating voltage source VS. When, however, a data line DL is to be operated as output dependent on the control signal ST, then the driver stages T1 and T2 are turned off and a driver stage T3 that was previously turned off is switched on. The matrix lines ML must then be connected to the operating voltage source VC.

The coupling lines KL are connected to the first operating voltage source VS via a resistor R1.

The adjustment matrix E-MA is constructed corresponding to the connection matrix V-MA. However, the adjustment sub-lines MDL are connected only to the operating voltage source VS via the resistor R2. Driver stages T4, T5 likewise lie in the adjustment sub-lines MDL.

There is an adjustment code for every desired connection possibility between the data lines DL, this adjustment code proceeding to the adjustment matrix E-MA via the adjustment terminals El through Em. For programming, a connection table is set up in the following way for that purpose:

The plurality of necessary adjustment terminals E is log 2 (plurality of adjustment possibilities).

One column in the connection matrix is provided for every data terminal AS and for every adjustment terminal E.

An adjustment code is defined for every adjustment possibility.

The possible bit combinations at the data terminals AS are defined for every adjustment possibility; one row in the connection table is needed for every bit combination.

The connection table is subsequently minimized.

This shall be set forth with reference to an example: A connection table for a connection network VN having four data terminals AS1 through AS4 is to be realized. In the first adjustment possibility, AS1 should be connected to AS2 and AS3 should be connected to AS4. In the second adjustment possibility, AS1 should be connected with AS2, AS3, AS4. Only a single adjustment terminal E is then required since there are only two possibilities. The signals at the data terminals AS are referenced a1 through a4; the signal at the adjustment line is referenced ml. The connection table then looks like this:

| a1, | a2, | a3, | a4, | ml. |
|---|---|---|---|---|
| 0 | 0 | 0 | 0 | 0 |
| 0 | 0 | 1 | 1 | 0 |
| 1 | 1 | 0 | 0 | 0 |
| 1 | 1 | 1 | 1 | 0 |
| 0 | 0 | 0 | 0 | 1 |
| 1 | 1 | 1 | 1 | 1 |

There is a connection between the data terminals AS1 to AS2 and between the data terminals AS3 and AS4 in the first four rows of the connection matrix. The data terminal AS1 is connected to AS2, AS3 and AS4 in the last two rows of the connection matrix.

Figure 5:
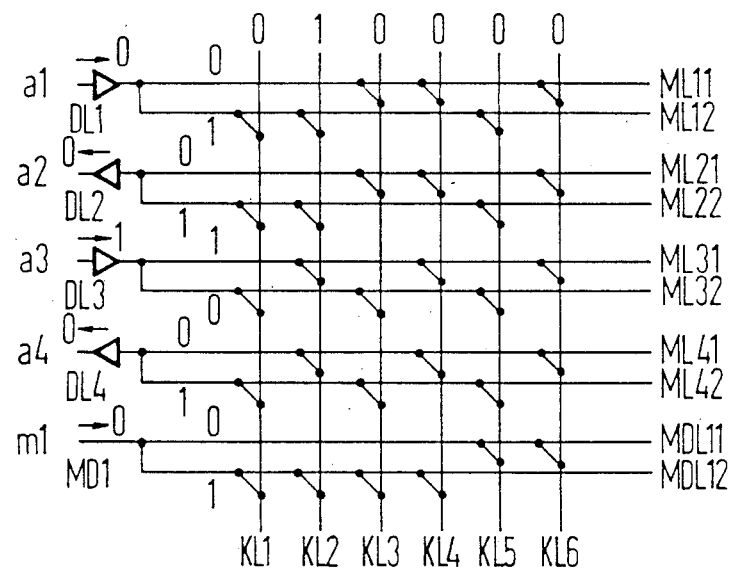
FIG. 5 and FIG. 6 examples of a programmed matrix.
Figure 6:
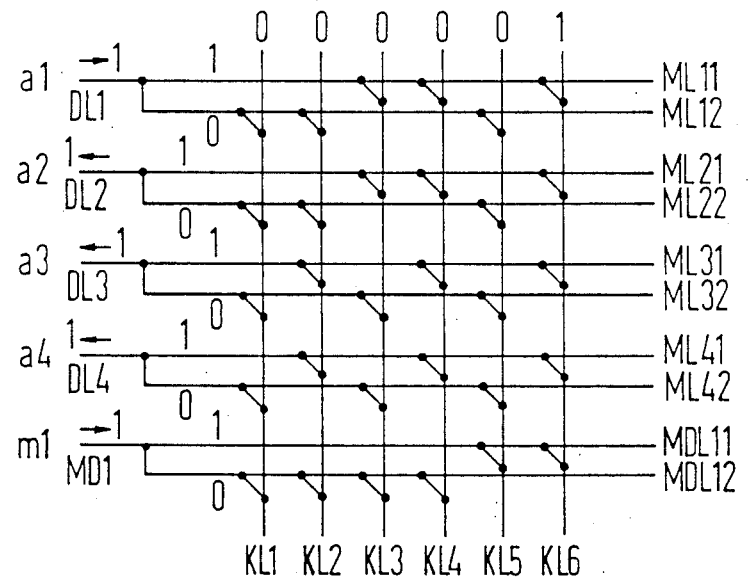

The programming of the matrix MA corresponding to this connection table can be derived from FIGS. 5 and 6. The rows of the connection table are thereby stored in the columns of the matrix or the columns of the connection table are realized in the rows of the matrix. The assistance of a dash is used to indicate whether a connection exists between a data line or adjustment sub-line and a coupling line. Let the programming be set forth with reference to the data line DL1 and with reference to the adjustment line MD1. In accord with the connection matrix for a1, the following programming is provided for the data line DL1: 0 0 1 1 0 1. A connection between the matrix line ML12 and the allocated coupling line is respectively provided given a binary 0; a connection between the matrix line ML11 and a coupling line KL is provided given the programming of a binary 1. The corresponding case also applies to the adjustment line MD corresponding to the column of the connection matrix for ml. The programming is corresponding 0 0 0 0 1 1.

FIG. 5 indicates the transmission of the data via the data line DL given the condition that the adjustment code is binary 0. Let a binary 0 be supplied to the data line DL1 connected as input; let a binary 1 be supplied to the data line DL3 connected as input. A binary 0 is then set on the coupling line KL1 because of a3; a binary 1 is then set on the coupling line KL2 because of a3; a binary 0 is set on the coupling line KL3 because of a1; a binary 0 is set on the coupling line KL4 because of a1; and a binary 0 is set on the coupling lines KL5 and KL6 because of ml. A binary 0 appears on the data line DL2 connected as output since the binary 1 on the coupling line KL2 cannot proceed to the output AS2. A binary 1, by contrast, appears on the data line DL4 since the binary 1 on the coupling line KL2 can proceed to the output AS4.

The explanation of the function shows that a binary 0 on one of the matrix lines ML or adjustment sub-line MDL penetrates via a logic element SE to the coupling line KL. Inversely, a binary 1 on a coupling line KL penetrates to the data lines D1 connected thereto when these data lines are connected as output.

The function of the connection table shall be set forth once again with reference to a second exemplary embodiment shown in FIG. 6. Let the adjustment code now be binary 1. When the data line DL1 that is connected as input is supplied with a binary 1, then binary 0 is established on the coupling lines KL1 through KL5 and a binary 1 is established on the coupling line KL6. In accord with the programming, the binary 1 on the coupling line KL1 penetrates to all [data lines] DL2 through DL4 connected as output, so that the output signal a2 through a4 is binary 1. The binary 1 is thus transmitted from the data lines DL1 onto the data lines DL2, DL3 and DL4.

The assistance of the adjustment code can thus be used to determine which data lines DL are connected to one another. The direction of the data transmission, by contrast, is determined with the assistance of the control signal ST. The following Table 2 shows when a data terminal AS can be input or output:

| ml | AS1 | AS2 | AS3 | AS4 |
|----|-----|-----|-----|-----|
| 0  | E   | A   | E   | A   |
| 0  | A   | E   | E   | A   |
| 0  | E   | A   | A   | E   |
| 0  | A   | E   | A   | E   |
| 1  | E   | A   | A   | A   |
| 1  | A   | E   | A   | A   |
| 1  | A   | A   | E   | A   |
| 1  | A   | A   | A   | E   |

Figure 7:
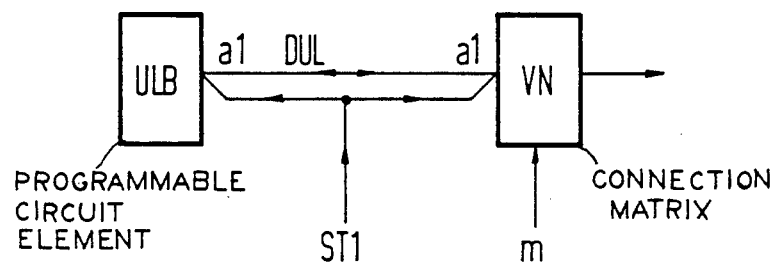
FIG. 7, 8 examples of the connection setup between two circuit arrangements.

The adjustment code thus sets the internal connections between the data lines DL. The control line ST sets the data direction on the data lines. Only one data line that is connected as input dare be connected to data lines that are connected as output. Some other connection is not allowed. Given unallowed connection set up, the monitoring means US activates a signal connection fault FB. FIG. 7 shows a connection between a circuit arrangement ULB and the connection network VN. When the data transmission line DUL in the ULB is switched as input, then it must be switched as output in the connection network VN. When the data transmission line DUL in the ULV is set as output, then it must be connected as input in the connection network VN. The allowed connections are stored in the monitoring means US in a ROM, RAM or PLA. The allowed connections are recited in Table 2 that has already been shown above.

Figure 8:
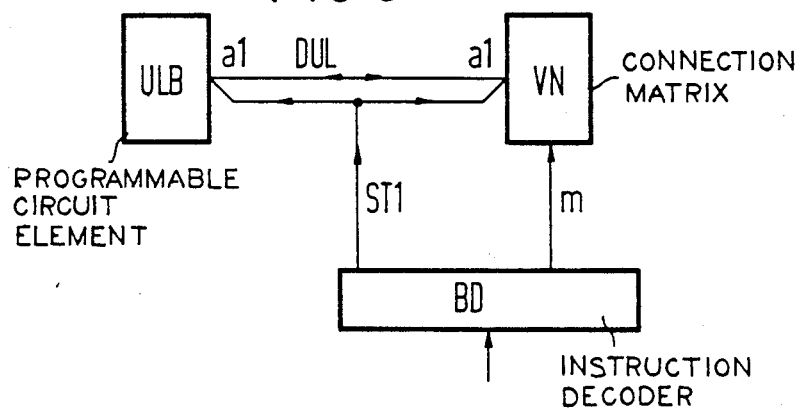

When it is assured that no unallowed connections occur, then the monitoring means US can be omitted. For example, this is the case when an instruction decoder BD in which the allowed connections are stored is provided in accord with FIG. 8.

Figure 9:
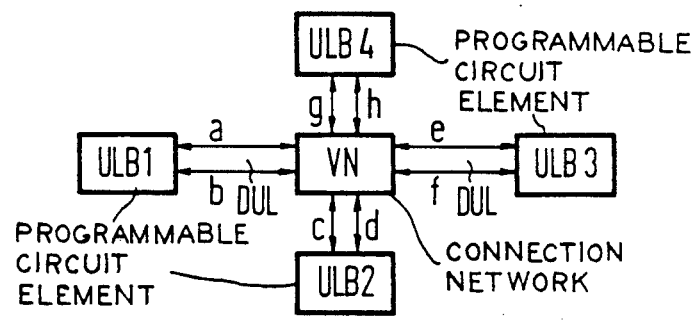
FIG. 9, 10 further examples of the connection of circuit arrangements with the assistance of the connection network.
Figure 10:
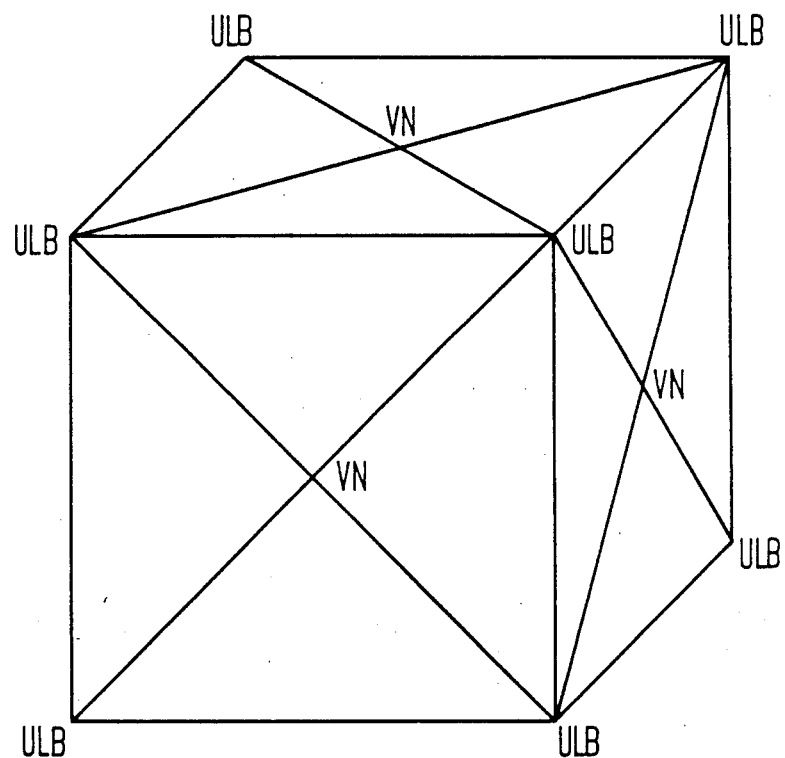

Further examples of connection networks comprising four circuit arrangements ULB derive from FIGS. 9 and 10. The connection network of FIG. 9 provides respectively two data transmission lines DUL between every ULB and the connection network VN. Each of these data transmission lines can be connected to each data transmission line of a different circuit arrangement via the connection network VN. FIG. 10 yields a network composed of a plurality of connection networks, whereby every connection network respectively collaborates with four circuit arrangements ULB. The circuit arrangements ULB can be interconnected to form a cube, whereby a connection network is arranged in every diagonal intersection of every corner of the cube.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

we claim:

1. Connection network for the adjustable connection of circuit elements, particularly programmable circuit elements, whereby every circuit element can be a transmitter or receiver, comprising:
   a matrix composed of a connection matrix and of an adjustment matrix;
   the connection matrix composed of bidirectionally operable data lines and of coupling lines crossing therewith and having programmable switching elements respectively connected between the data lines and the coupling lines at the crossing locations of the data lines and coupling lines;
   data terminals of the data line connected to terminals of the circuit elements;
   the adjustment matrix composed of the coupling lines and of adjustment lines crossing therewith and having programmable switching elements respectively connected between the coupling lines and adjustment lines at the crossing locations of the coupling lines and adjustment lines;
   data terminals being connected to one another within the connection matrix by applying an adjustment code to the adjustment lines of the adjustment matrix.

2. Connection network according to claim 1, wherein the switching elements are disconnectable switch elements each of which is respectively coupled between a data line or, respectively, an adjustment line and a coupling line.

3. Connection network according to claim 2, wherein an input circuit is coupled in every data line, a control signal being received by the input circuit that controls driver stages located in the input circuit such that the associated data terminal represents either a data input or a data output.

4. Connection network according to claim 3, wherein each data line branches into first and second matrix lines, whereby the input circuit is composed of a first drive stage connected to the first matrix line, of a second, inverting driver stage connected to the second matrix line and of a third driver stage having an input connected to an output of the first driver stage and an output connected to inputs of the first and second driver stages and wherein every driver stage can be disconnected by the control signal.

5. Connection network according to claim 2, wherein every adjustment line branches into two matrix lines whereof the one receives an adjustment signal and the other receives the adjustment signal inverted.

6. Connection network according to claim 4, wherein each switching element per data line has two switch devices connected between the first and second matrix lines allocated to the data line and the coupling lines, respectively, and being programmed according to a connection table.

7. Connection network according to claim 6, wherein a non-disconnected switch device is coupled between one matrix line and a coupling line for programming a binary logic 1 and a non-disconnected switch device is coupled between the other matrix line and the coupling line for programming a binary logic 0.

8. Connection network according to claim 7, wherein only disconnected switch devices are coupled between the first and second matrix lines of a data line and a coupling line for programming a third status different from a first status of the logic 1 and from a second status of the logic 0.

9. Connection network according to claim 5, wherein when operating a data line as input, the allocated matrix lines are connected to a first operating voltage source via a resistor and, given operation as output, the allocated matrix lines are connected to a second operating voltage source via a resistor.

10. Connection network according to claim 9, wherein the coupling lines are connected to the first operating voltage source via a resistor.

11. Connection network according to claim 1, wherein a monitoring means is additionally provided in which allowed connections between the data terminals are stored and is connected to the lines for the control signals and for the adjustment code.

12. Circuit arrangement according to claim 1, wherein a plurality of connection networks are provided, being respectively connected to a plurality of circuit elements.

13. Connection network according to claim 5, wherein each switching element per adjustment line has two switch devices connected between the first and second matrix lines allocated to the adjustment line and the coupling lines, respectively and being programmed according to a connection table.

14. Connection network according to claim 13, wherein a non-disconnected switch device is coupled between one matrix line and a coupling line for programming a binary logic 1 and a non-disconnected switch device is coupled between the other matrix line and the coupling line for programming a binary logic 0.

* * * * *